United States Patent [19]

Minas et al.

[11] Patent Number: 5,129,232
[45] Date of Patent: Jul. 14, 1992

[54] VIBRATION ISOLATION OF SUPERCONDUCTING MAGNETS

[75] Inventors: Constantinos Minas, Slingerlands; Kenneth G. Herd; Evangelos T. Laskaris, both of Schenectady, all of N.Y.

[73] Assignee: General Electric Company, Schenectady, N.Y.

[21] Appl. No.: 709,527

[22] Filed: Jun. 3, 1991

[51] Int. Cl.$^5$ ............................................. F25B 19/00
[52] U.S. Cl. ......................................... 62/51.1; 62/295; 62/297; 248/636; 248/638; 505/892
[58] Field of Search ........................ 62/51.1, 55.5, 295, 62/297; 248/636, 638; 55/269; 417/901; 505/892

[56] References Cited

U.S. PATENT DOCUMENTS

| | | |
|---|---|---|
| 4,363,217 | 12/1982 | Venuti .................................. 62/295 |
| 4,394,819 | 7/1983 | Averill .................................. 62/295 |
| 4,539,822 | 9/1985 | Sundquist ............................. 62/295 |
| 4,745,761 | 5/1988 | Bazat et al. .......................... 62/295 |
| 4,777,807 | 10/1988 | White .................................. 62/295 |
| 4,838,033 | 6/1989 | Yamamoto et al. ................. 62/51.1 |
| 4,878,351 | 11/1989 | Weber et al. ........................ 62/297 |
| 4,926,647 | 5/1990 | Dorri et al. .......................... 62/51.1 |
| 4,930,318 | 6/1990 | Brzozowski ......................... 62/295 |
| 4,986,078 | 1/1991 | Laskaris ............................... 62/51.1 |

Primary Examiner—Ronald C. Capossella
Attorney, Agent, or Firm—James R. McDaniel; James C. Davis, Jr.; Paul R. Webb, II

[57] ABSTRACT

In order to improve image resolution and magnetic field uniformity in a magnetic resonance imaging device, the vibrations and loads produced by the cryocooler are isolated from the superconducting magnet and cryostat. The vibrations and loads are isolated through the use of flexible, laminated copper connectors and rubber mounts.

7 Claims, 6 Drawing Sheets

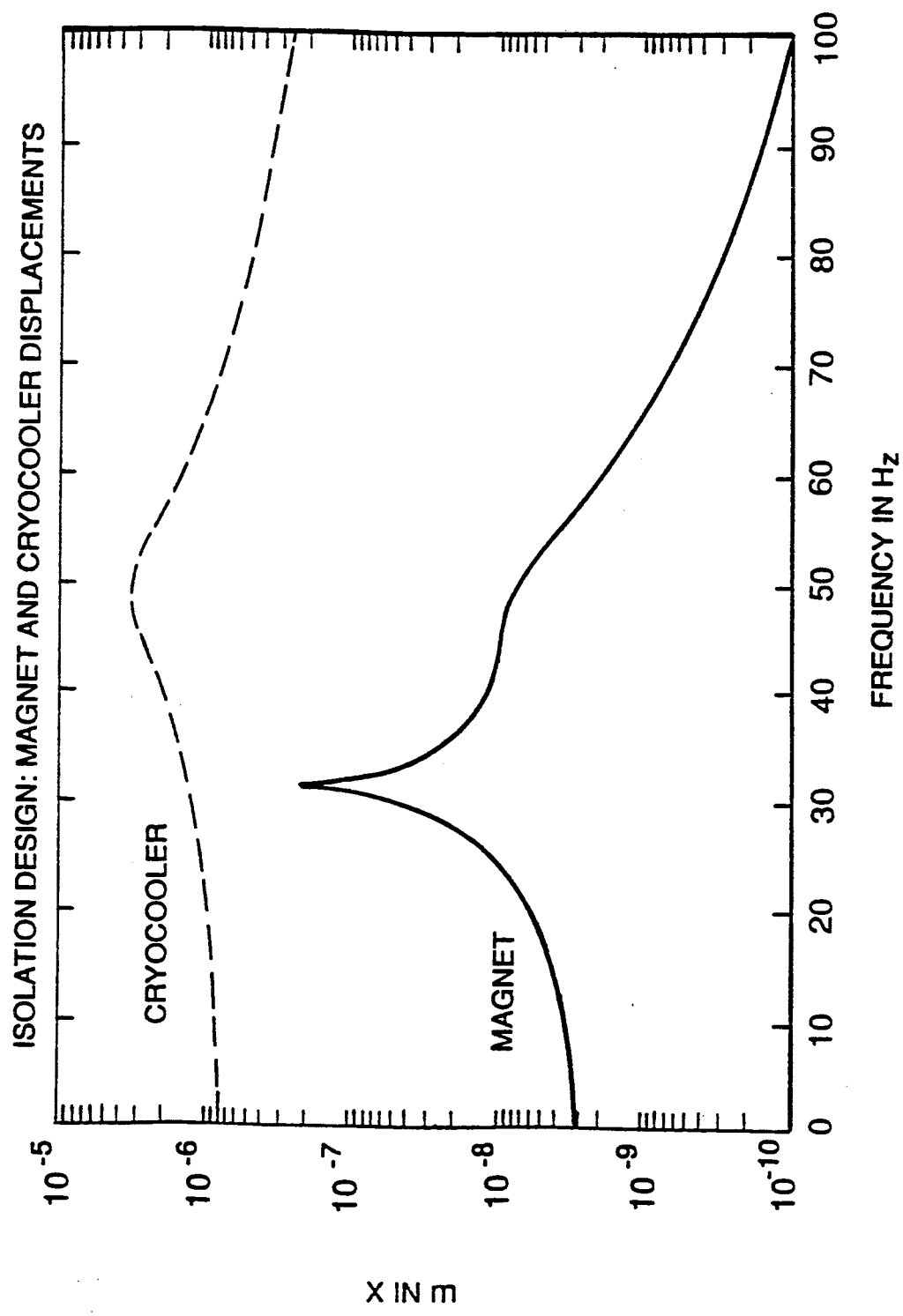

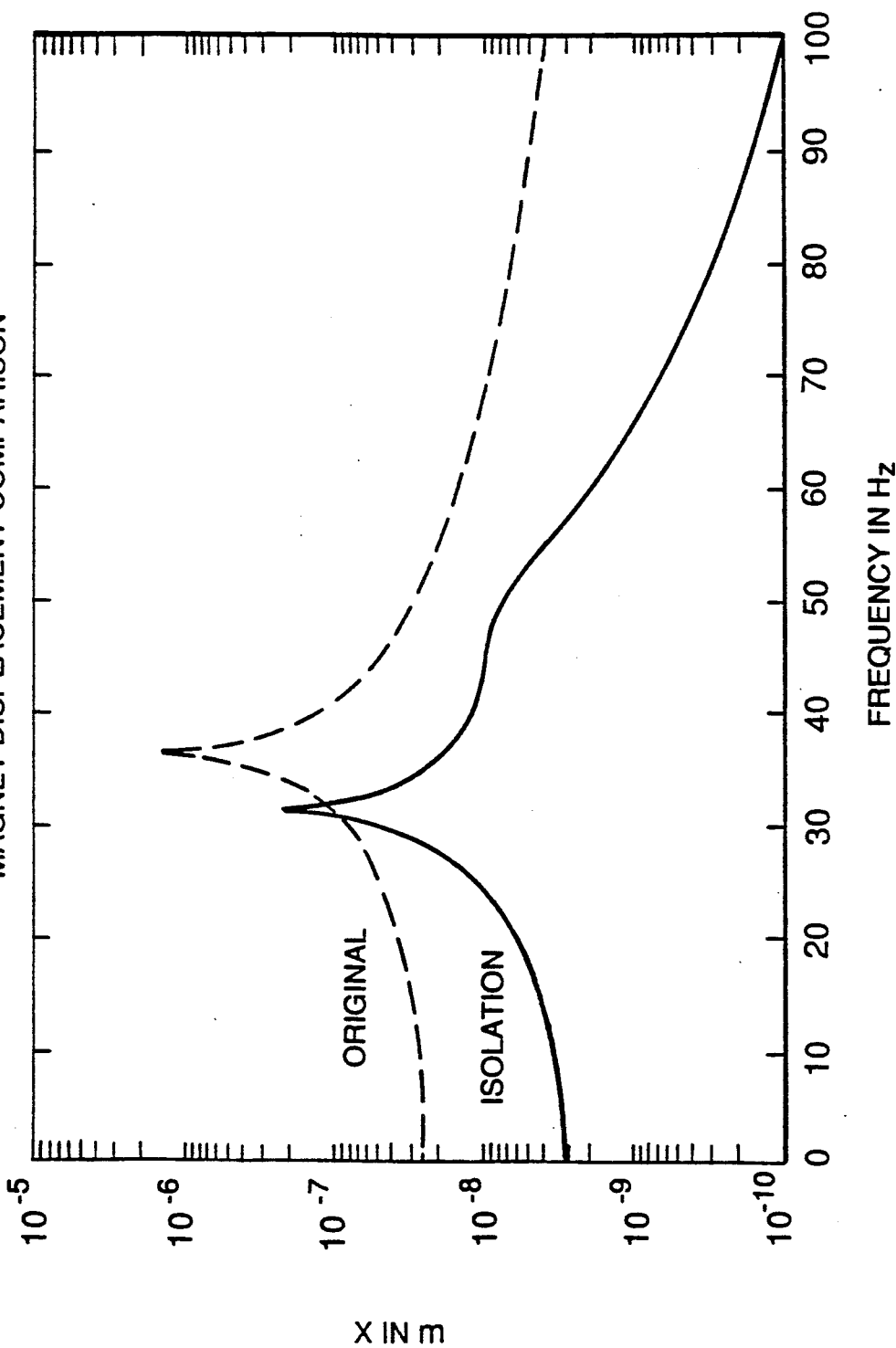

VIBRATION ISOLATION OF SUPERCONDUCTING MAGNETS

CROSS REFERENCE TO RELATED APPLICATIONS

The present invention is related to commonly assigned U.S. Patent application Ser. No. (RD-19,496), entitled "OPEN MRI MAGNET".

BACKGROUND OF THE INVENTION

1. Field of the Invention

This invention relates to vibration isolation systems for superconducting magnets used in magnetic resonant imaging devices such that the vibration system is constructed of flexible isolators attached between the magnet and the cryocooler and, also, between the cryocooler and the cryostat. Such structures of this type, generally, allow substantially all of the forces created by the vibrating cryocooler to be dampened out while still providing adequate thermal conductivity and support in the vibration isolation system which, ultimately, increases the image resolution and the magnetic field uniformity of the imaging device.

2. Description of the Related Art

It is known, in superconducting magnet systems used in magnetic resonance imaging devices that in order to provide adequate thermal conductivity between the cryocooler and the magnet, one has to rigidly connect the second stage of the cryocooler directly to the magnet so that the magnet will be adequately maintained at a temperature of approximately 10 K. Also, the first stage of the cryocooler is rigidly attached by a direct connection to the thermal shield of the magnet so that shield will be maintained at a temperature of approximately 40 K. Finally, the entire cryocooler is rigidly attached by a direct connection to the cryostat vacuum enclosure in order to support the cryocooler assembly within the cryostat as the cryocooler contacts the magnet and the shield. While such rigid connections provide adequate thermal conductivity, any vibration produced by the cryocooler during its operation is transferred directly to the shield and the magnet which adversely affects the image resolution and magnet field uniformity of the imaging device, thereby, causing undesirable artifacts in the images produced. Consequently, a more advantageous system, then, would be presented if such amounts of vibration were reduced or eliminated while still providing adequate thermal conductivity and support.

It is apparent from the above that there exists a need in the art for a vibration isolation system which is lightweight through simplicity of parts and uniqueness of structure, and which at least equals the safety and thermal conductivity characteristics of known superconducting magnet mounts for magnetic resonance imaging devices, but which at the same time substantially reduces the amount of vibration being transferred from the cryocooler to the magnet, the shield and the cryostat. It is a purpose of this invention to fulfill this and other needs in the art in a manner more apparent to the skilled artisan once given the following disclosure.

SUMMARY OF THE INVENTION

Generally speaking, this invention fulfills these needs by providing a vibration isolation system for a superconducting magnet having a magnet and a thermal shield, comprising a cryocooler means having first and second stages, a cryostat means, and resilient vibration isolator means connected between said superconducting magnet and said cryocooler means and also, between said cryocooler means and said cryostat means.

In certain preferred embodiments, the resilient vibration isolators operating below room temperature are flexible laminated copper sheets and rubber mounts for room temperature operation. Also, the copper sheets are used to thermally connect the cryocooler second stage to the magnet and the cryocooler first stage to the thermal shield, respectively. Finally, the rubber mounts provide vibration isolation between the cryocooler and the cryostat vacuum enclosure.

In another further preferred embodiment, substantially all of the vibration produced by the cryocooler is transferred to the resilient vibration isolators and efficiently dampened out while still providing adequate thermal conductivity and support between the magnet and the cryocooler.

The preferred vibration isolation system, according to this invention, offers the following advantages: light weight; easy assembly; good economy; excellent thermal conductivity; good stability; high strength for safety; good durability; and excellent vibration isolation. In fact, in many of the preferred embodiments, these factors of thermal conductivity and vibration isolation are optimized to an extent considerably higher than heretofore achieved in prior, known superconducting magnet suspension systems.

BRIEF DESCRIPTION OF THE DRAWINGS

The above and other features of the present invention which will become more apparent as the description proceeds are best understood by considering the following detailed description in conjunction with the accompanying drawings wherein like characters represent like parts throughout the several views and in which:

FIG. 5 is a graphical representation of the response to a unit force of the cryocooler and the magnet as a function of applied frequency; and FIG. 6 is a graphical representation of the magnet vibration prior to and during use of the present invention.

DETAILED DESCRIPTION OF THE INVENTION

Figure 1:
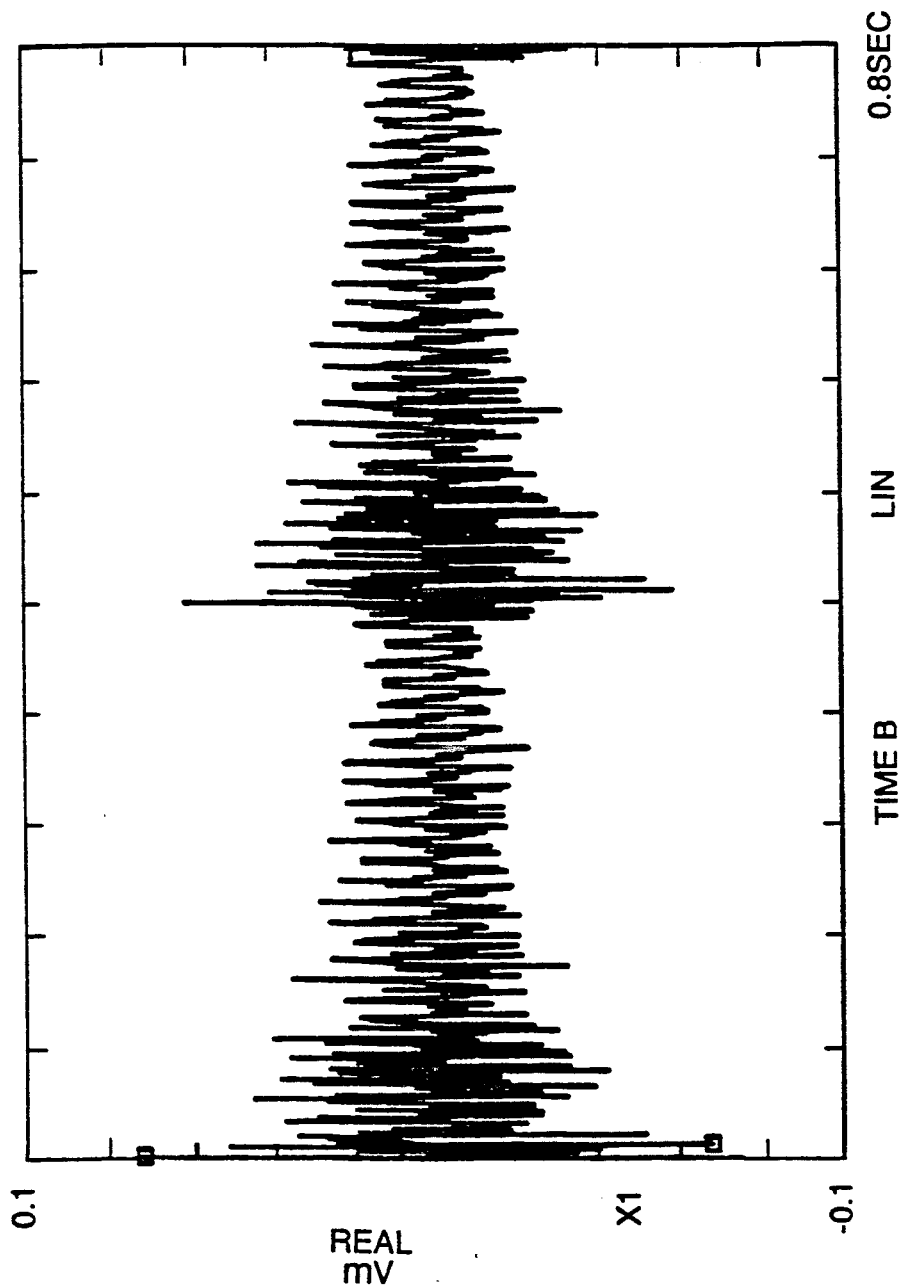
FIG. 1 is a graphical representation of the periodical vibration produced by a conventional Gifford-McMahon cryocooler.

With reference first to FIG. 1, there is illustrated a typical graphical representation of the vibration characteristics of a conventional Gifford-McMahon cryocooler where vibration acceleration in meters per second squared is plotted against time in seconds. As can be seen, the vibration is cyclical with a cycle lasting approximately 0.5 seconds. Also, the graph shows that there is a large vibration at the beginning of the cycle and the vibration dampens out over the length of the cycle. The initially large vibration is due to the piston which is contained within the cryocooler impacting against the cryocooler housing as the piston performs its refrigeration cycle.

Figure 2:
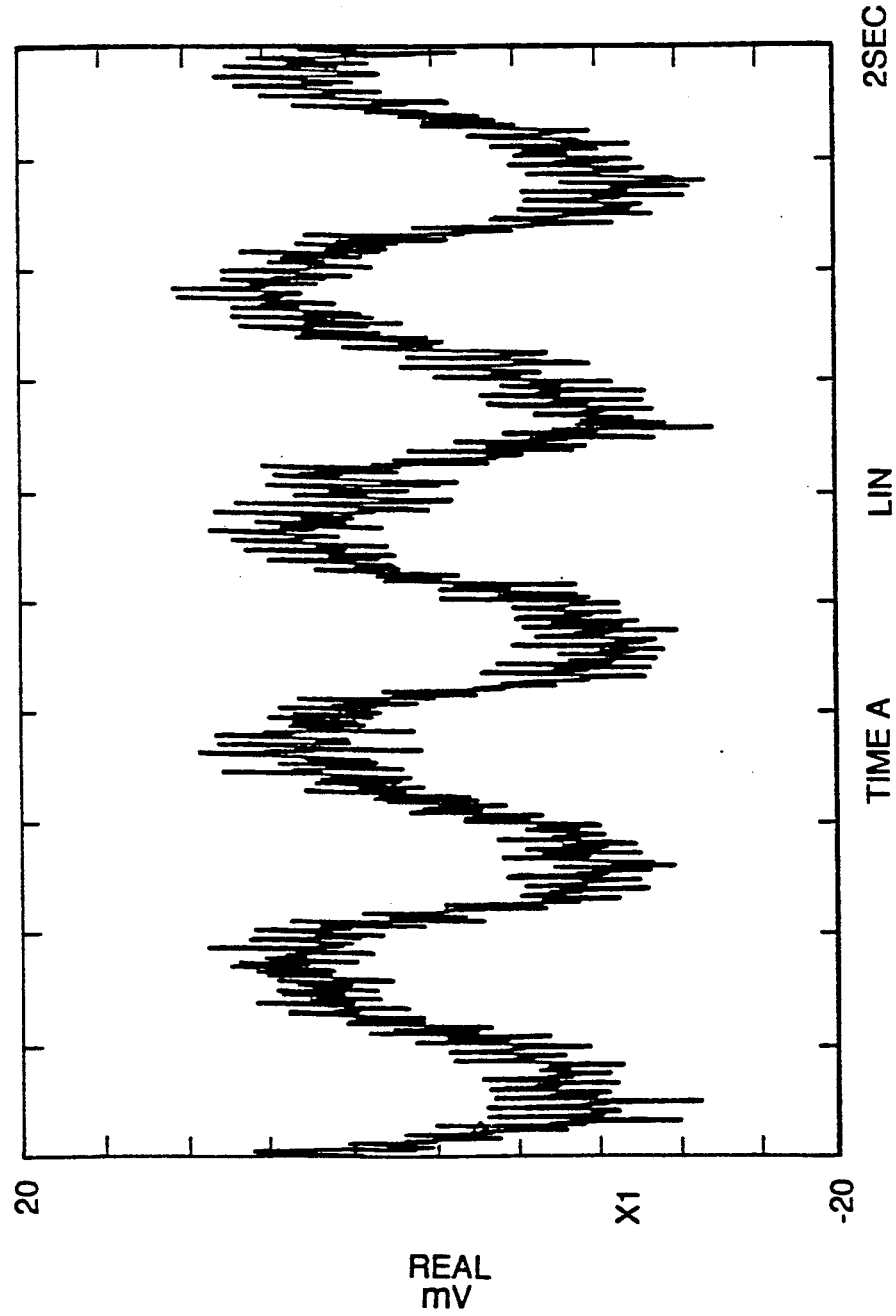
FIG. 2 is a graphical representation of the periodical vibration experienced by the superconducting magnet due to the vibration of the cryocooler.

As the piston impacts against the cryocooler, this impacting as shown in FIG. 1 is cyclical. The cyclical impacting or vibration is transferred to the superconducting magnet to the point where the magnet also vibrates as shown in FIG. 2. FIG. 2 shows a typical graphical representation of the vibration characteristics of a conventional superconducting magnet due to cryocooler vibration where magnet vibration acceleration in meters per second squared is plotted against time in seconds. As can be seen, the vibration is cyclical with the frequency being approximately 2.4 Hz. Consequently, the present invention attempts to isolate the various vibrations in order to both reduce the cryocooler impacting and the superconducting magnet vibration.

Figure 3:
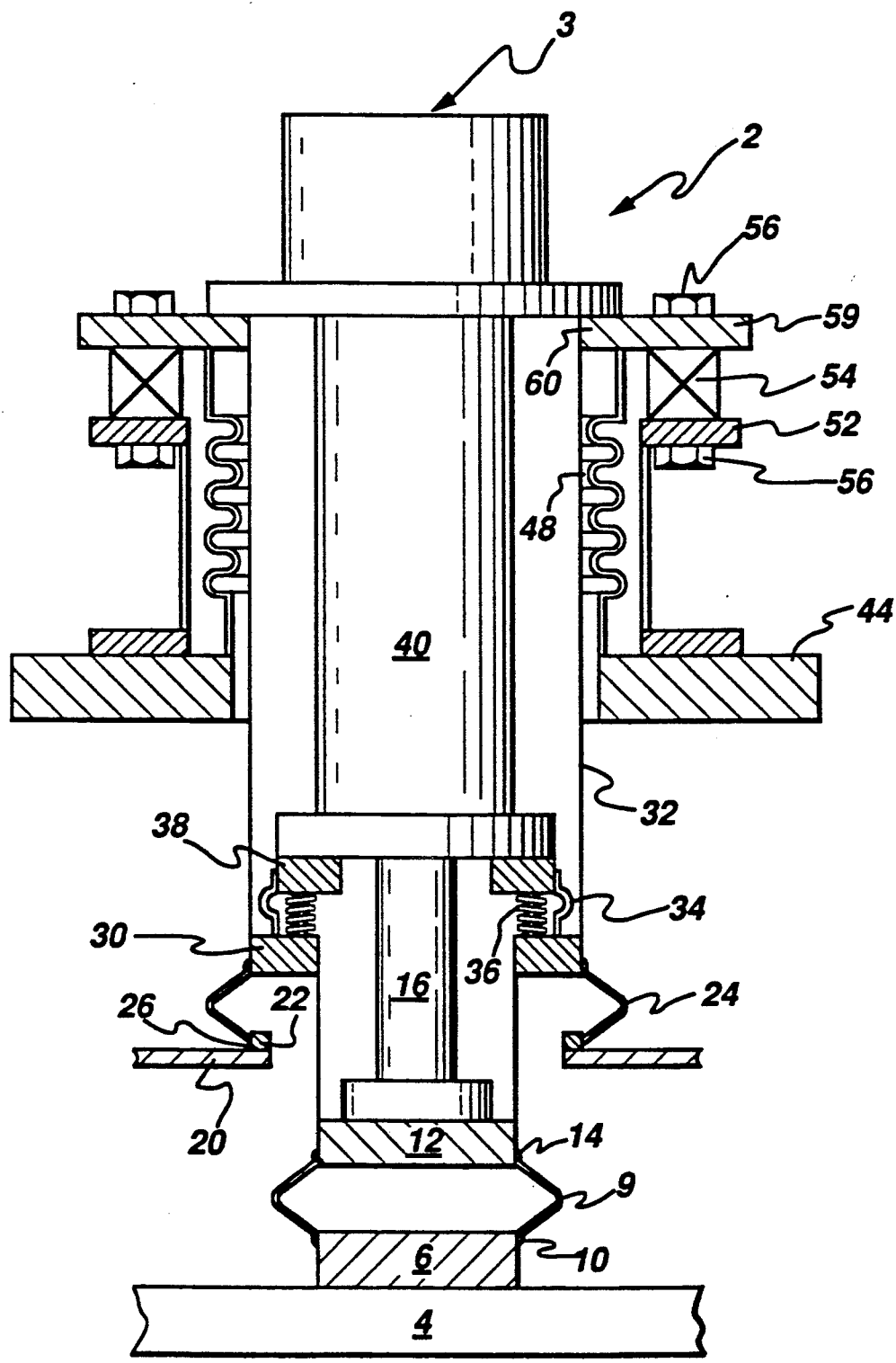
FIG. 3 is a schematic drawing of the vibration isolation system for a superconducting magnet, according to the present invention.

With that background in mind, FIG. 3 illustrates vibration isolation system 2. In particular, system includes cryocooler 3, magnet 4, thermal shield 20 and isolators 9, 24 and 54. Magnet 4 which is, preferably, a 0.5 Tesla magnet maintained at approximately a temperature of 10 K. in operation is rigidly attached to hard contact 6, preferably, by bolts (not shown). Flexible thermal connectors 9, preferably, constructed of laminated oxygen-free-hard copper, hereinafter referred to as OFHC are, preferably, welded by conventional welding techniques at one end by weldments 10 to hard contact 6 and welded at the other end by conventional weldments 14 to support plate 12. Support plate 12, preferably, is constructed of copper. Support plate 12, preferably, is brazed by conventional brazing techniques to one end of thin wall tube 18 and second stage 16 of cryocooler 3 rests on top of support plate 12. Thin wall tube 18, preferably, is constructed of stainless steel. The other end of thin wall tube 18, preferably, is brazed to support plate 30. Support plate 30, preferably, is constructed of copper.

Thermal shield 20, which is maintained at approximately a temperature of 40 K. in operation, is rigidly attached to contact 22. Contact 22, preferably, is constructed of copper. Contact 22 is rigidly attached to one end of flexible thermal connector 24 by a conventional weldment 26. Connector 24, preferably, is constructed of laminated OFHC. The other end of connector 24 is rigidly attached to support plate 30 by a conventional weldment 28.

Rigidly attached to support plate 30 is one end of support tube 32. Support tube 32, preferably, is brazed by conventional brazing techniques to support plate 30. Support tube 32, preferably, is constructed of non-magnetic stainless steel, hereinafter referred to as NMSS. Located on top of support plate 30 is a flexible thermal connector 34. Connector 34, preferably, is constructed of any suitable copper laminate and one end is welded by conventional welding techniques to support plate 30. Also, a conventional Belleville spring washer assembly 36 is rigidly attached to support plate 30 by conventional fasteners (not shown) such that spring washer assembly 36 provides compression between plate 38 and support plate 30. Plate 38, preferably, is constructed of copper. First stage 40 of cryocooler 3 rests on top of plate 38.

Cryostat 44 which is, preferably, constructed of NMSS, is used to support cryocooler 3 as cryocooler 3 contacts both magnet 4 and thermal shield 20 in order to cool both magnet 4 and shield 20. Cryostat 44 is rigidly attached to one end of bracket 52, preferably, by conventional welding techniques. Bracket 52, preferably, is constructed of NMSS. The other end of bracket 52 is rigidly attached to one end of isolator 54 by a conventional fastener 56. Isolator 54, preferably, is a Flex-Bolt Sandwich Mount, model J-11729-168, manufactured by the Lord Corporation. The other end of isolator 54 is rigidly attached to plate 59 by a conventional fastener 56. Plate 59, preferably, is constructed of NMSS. The other end of thermal connector 32 is rigidly attached to plate 59 by a conventional weldment 60. The upper end of cryocooler 3 rests on top of plate 59.

Figure 4A:
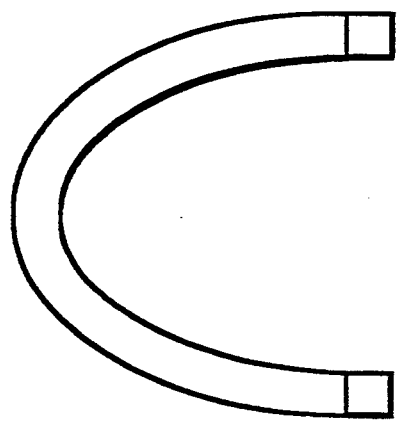
FIGS. 4a–4c are several embodiments of the magnet and shield vibration isolators, according to the present invention.
Figure 4B:
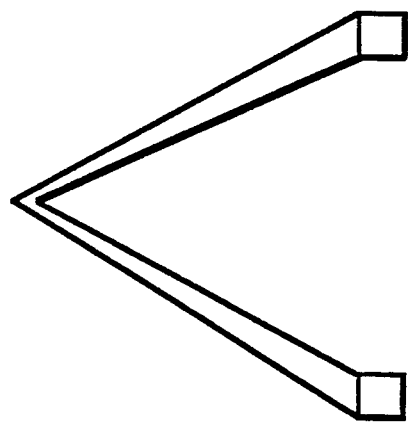
Figure 4C:
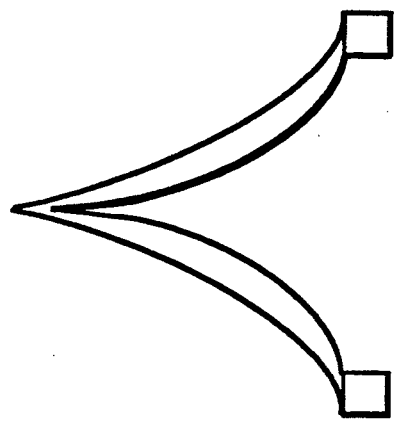

With respect to FIG. 4, there are illustrated three different embodiments for thermal connectors 9, 24. While the embodiments differ in their geometric shape, all the shapes were developed from a common design theory which is set forth below. In particular, the heat transfer criterion of the cryocooler-magnet interface was set equal to 0.1K/W, which through conventional mathematical analysis using well-known heat transfer equations required a length over area ratio (L/A) of 0.8 cm$^{-1}$. The dynamic behavior of n copper sheets, laminated and welded at the ends can be approximated by n cantilever beams acting independently. From the well-known beam theory the stiffness of a cantilever beam is given by:

$$K = Enbt^3/4L^3 \qquad (1)$$

where E is the Young's modulus, and L is the length of the beam. The symbols b and t denote the width and the thickness of the sheets. The cross-section area which represents the conduction area is given by:

$$A = nbt$$

where n is the number of sheets. Since the stiffness is proportional to the third power of the thickness, the thickness must be minimized and the width of the sheet must be maximized such that the sheet occupies all the available area. To obtain the desired conduction area A, it can be seen that the stiffness is lower when more sheets of lower thickness are used. Consequently, thermal connectors 9, 24 are, preferably, made of 25 copper sheets of 0.005 in thickness per sheet. It is to be understood that to maintain the same conduction area A and further increase the flexibility, 42 copper sheets of 0.003 in thickness per sheet could also be used.

Several dynamic analyses were performed to determine the most flexible geometry of the component. Some results are presented in FIGS. 4a–4c where three geometries are examined for stiffness determination. It was discovered that the geometry presented in FIG. 4c was the most flexible. An important factor in the manufacture of the flexible piece is the fact that the copper sheets must behave independently of each other such that the stiffness is minimized. This can be achieved by, preferably, stacking the sheets together, bending them around a thin steel plate using conventional bending techniques, welding the ends using conventional welding techniques, and bending them outwards to the desired shape, again, by using conventional bending techniques. In the case where the sheets are behaving as a solid piece, equation (1) is no longer valid and the actual stiffness is higher by a factor of $n^2$, given by:

$$K = Eb(nt)^3/4L^3 \qquad (2)$$

The stiffness of a single copper sheet ($K_{s1}$) in the thermal connectors 9,24 of FIG. 3 was theoretically estimated through finite element modeling to be:

$$K_{s1} = 96.8 N/m$$

Therefore, the stiffness of a component consisting of 25 copper sheets dynamically independent is estimated to be:

$$K_c = 25 \times 96.8 = 2420 N/m$$

Note that in the case where the sheets are behaving as a solid piece, the estimated stiffness is expected to be:

$$K_s = 1.4185E7 N/m$$

which is approximately 6000 times higher than Kc.

The stiffness of the component was experimentally measured by conventional stiffness measuring techniques to be:

$$K_c = 2151 N/m \pm 200 N/m$$

which proves that the copper sheets were truly behaving independently. The total stiffness of the interface which consist of four components, is measured through conventional stiffness measuring techniques to be:

$$K_t = 42390 N/m$$

This was found to be higher than four times $K_c$. This is probably due to the fact that the fixed-fixed boundary conditions are now reinforced which reduces the effective length of the component. The first stage cryocooler-magnet interface can be made of the same connections, bringing the total stiffness of the interface to 84780 N/m.

Isolators 54 (FIG. 3) are used to provide vibration isolation between the cryostat 44 and cryocooler 3. An analysis as to the particular requirements for isolators 54 is presented below. The isolators 54 are made of Flex-Bolt Sandwich mounts with the following characteristics:

$$K = 1.3134E5 N/m$$

$$\text{Max load} = 822.9 N$$

The weight of cryocooler is approximately 15 Kg, and the force due to the pressure difference between cryocooler 3 and cryostat 44 is calculated to be 5133N. This corresponds to a compressive force of 5280N that must be reacted at isolators 54. This will require 6.4 isolators 54 that will be fully compressed under operating conditions. The preferred system consists of 8 isolators 54, which ensures that the isolators 54 are not fully compressed and provide the required vibration isolation.

In operation of the entire system 2, as cryocooler 3 is operating, the piston (not shown) inside of cryocooler 3 reciprocates and creates a vibration (FIG. 1). This vibration is transferred to magnet 4 and shield 10 which causes magnet 4 and shield 10 to vibrate (FIG. 2) and which causes thermal connectors 9,24 to flex. Also, as discussed earlier, the difference in pressure between cryocooler 3 and cryostat 44 causes cryocooler 3 to press down on bracket 59 and, ultimately, to compress isolator 54. The flexure of connectors 9,24 and compression of isolator 54 substantially dampens out all of the vibrations created by cryocooler 3. The dampening out of these vibrations increases the image resolution and magnetic field uniformity of the imaging device.

The response to a unit force of the cryocooler and the magnet as a function of applied frequency are presented in FIG. 5. Throughout the entire range, with the exception of the area around 33 Hz where the magnet resonant frequency appears, the motion of the cryocooler is at least 100 times higher than the motion of the magnet. It was shown in FIG. 2 that the cryocooler excitation, can be approximated by a sinusoidal force with the frequency being the cryocooler operating frequency of 2.4 Hz. At this frequency, the cryocooler amplitude is found to be 8E-7 m and the magnet amplitude is 3E-9 m, that is 0.375% of the cryocooler amplitude. Furthermore, if one could reduce the cryocooler motion, the magnet motion would, in turn, be reduced.

The magnet displacement as a function of applied frequency for the original design and vibration isolation design is presented in FIG. 6. It can be observed that at the cryocooler operating frequency of 2.4 Hz, the original design results in a magnet amplitude of 2.8E-8 m. Therefore, the vibration isolation design embodied in the present invention clearly reduces the motion of the magnet due to the cryocooler excitation by a factor of 9.3.

Once given the above disclosure, many other features, modifications or improvements will become apparent to the skilled artisan. Such features, modifications or improvements are, therefore, considered to be a part of this invention, the scope of which is to be determined by the following claims.

What is claimed is:

1. A vibration isolation system for a superconducting magnet having a first magnet and a thermal shield which is comprised of:

a cryocooler means having first and second stages and located substantially adjacent to said thermal shield;

a cryostat means located substantially adjacent said cryocooler means; and resilient vibration isolator means connected between said first magnet and said cryocooler means and also, between said cryocooler means and cryostat means.

2. The vibration isolation system, according to claim 1, wherein said resilient vibration isolator means are further comprised of:

a flexible, laminated metallic material.

3. The vibration isolation system, according to claim 2, wherein said metallic material is further comprised of:

copper sheets.

4. The vibration isolation system, according to claim 2, wherein said metallic material mechanically separates, thermally connects and vibrationally isolates said magnet and said second stage.

5. The vibration isolation system, according to claim 2, wherein said metallic material mechanically separates, thermally connects and vibrationally isolates said thermal shield and said first stage.

6. The vibration isolation system, according to claim 2, wherein said rubber-like material vibrationally isolates said cryocooler means and said cryostat means.

7. The vibration isolation system, according to claim 1, wherein said resilient vibration isolator means are further comprised of:

a compressible rubber-like material.

* * * * *